(12) United States Patent
Liang

(10) Patent No.: US 7,126,819 B2
(45) Date of Patent: Oct. 24, 2006

(54) CHASSIS AIR GUIDE THERMAL COOLING SOLUTION

(76) Inventor: Hsien-Rong Liang, P.O. Box No. 6-57, Junghe, Taipei 235 (TW)

( * ) Notice: Subject to any disclaimer, the term of this patent is extended or adjusted under 35 U.S.C. 154(b) by 280 days.

(21) Appl. No.: 10/823,671

(22) Filed: Apr. 14, 2004

(65) Prior Publication Data

US 2005/0231909 A1 Oct. 20, 2005

(51) Int. Cl.
*H05K 7/20* (2006.01)
*G06F 1/20* (2006.01)
*F28F 7/00* (2006.01)
*H01L 23/34* (2006.01)
*H01B 9/06* (2006.01)

(52) U.S. Cl. .................. 361/695; 361/687; 361/688; 361/697; 165/185; 165/80.3; 257/713; 257/718; 257/721; 257/722; 174/15.1

(58) Field of Classification Search ................ 361/695
See application file for complete search history.

(56) References Cited

U.S. PATENT DOCUMENTS

| | | | | |
|---|---|---|---|---|
| 6,125,924 A * | 10/2000 | Lin | ............................ | 165/122 |
| 6,145,586 A * | 11/2000 | Lo | ............................ | 165/80.3 |
| 6,567,267 B1 * | 5/2003 | Wang | ............................ | 361/695 |
| 6,587,335 B1 * | 7/2003 | Nelson et al. | ............... | 361/687 |
| 6,791,837 B1 * | 9/2004 | Chen et al. | .................. | 361/695 |
| 6,930,882 B1 * | 8/2005 | Broder et al. | ................ | 361/695 |
| 2004/0095723 A1 * | 5/2004 | Tsai et al. | .................... | 361/695 |
| 2004/0196629 A1 * | 10/2004 | Broder et al. | ................ | 361/695 |
| 2005/0073812 A1 * | 4/2005 | Lin | ............................ | 361/695 |
| 2005/0174732 A1 * | 8/2005 | Lin | ............................ | 361/695 |
| 2005/0201056 A1 * | 9/2005 | Lin | ............................ | 361/695 |

* cited by examiner

*Primary Examiner*—Lisa Lea-Edmonds
*Assistant Examiner*—Zachary Pape

(57) ABSTRACT

A chassis air guide thermal cooling solution including a fan to which protruding edges are wedged at wedge grooves of a locating assembly to locate the fan therein, locating notches of a flexible ring are positioned in the locating assembly, an accommodating ring is accommodated around the flexible ring, and the locating assembly is fastened with a locating plate by means of screws; a side panel is devised with ventilation openings for drawing external air or discharging hot air at the interior of the device. The locating assembly is provided with a plurality of flexible openings, and after having fixed the locating plate therein, an assembled position of the chassis air guide thermal cooling solution is adjusted; after having assembled the chassis air guide thermal cooling solution therein, a distance between the accommodating ring and the heat dissipating fan is adjusted using the flexible ring.

5 Claims, 7 Drawing Sheets

CHASSIS AIR GUIDE THERMAL COOLING SOLUTION

BACKGROUND OF THE INVENTION (a) Field of the Invention

The invention relates to a chassis air guide thermal cooling solution. More particularly, to a chassis air guide thermal cooling solution characterized that, protruding edges of a fan are wedged at wedge grooves of a locating assembly to locate the fan in the locating assembly, locating notches of a flexible ring are positioned in the locating assembly, an accommodating ring is accommodated around the flexible ring, and the locating assembly is fastened with a locating plate by means of screws; a side panel is devised with ventilation openings for facilitating the fan to draw external air or to discharge hot air in an interior of the device; and the locating assembly is provided with a plurality of flexible openings.

To assemble the chassis air guide thermal cooling solution, after having fixed the locating plate to the interior of the device, an assembled position of the chassis air guide thermal cooling solution is adjusted, and the locating assembly, the locating plate and a power supply are fixed using screws.

After having assembled the chassis air guide thermal cooling solution at the interior, a distance between the accommodating ring and the heat dissipating fan is adjusted using the flexible ring, so as to further favor a user to adjust a length of the flexible ring for coordinating with equipment arrangement at the interior of the device.

(b) Description of the Prior Art

A prior heat dissipating device, such as a heat dissipating device used in a central processing unit of a personal computer, utilizes cooling fins made of materials having high thermal conductance and a fan having high rotational speed. However, the entire heat dissipating device is located in an enclosed space, and hot air is continuously circulated by convection within an interior with reduced heat dissipating effects. Supposed that the interior accommodates numerous devices, heat dissipating effects are further lowered, and hence damages are likely resulted in case that the devices are precision equipments.

Therefore, it is a technical issue of the invention as how to enhance heat dissipating effects of a chassis air guide thermal cooling solution and to reinforce air convection relative to an interior and an exterior of the device.

SUMMARY OF THE INVENTION

With reference to FIGS. 1 and 2 showing a chassis air guide thermal cooling solution according to the invention, a chassis air guide thermal cooling solution A comprises a side panel B, a locating plate C, a locating assembly D, a fan E, a flexible ring F and an accommodating ring G.

The invention is characterized that, protruding edges E1 of the fan E are wedged at wedge grooves D2 of the locating assembly D to locate the fan E in the locating assembly D, locating notches F1 of the flexible ring F are positioned in the locating assembly D, the accommodating ring G is accommodated around the flexible ring F, and the locating assembly D is fastened with the locating plate C by means of screws; and the side panel B is devised with ventilation openings B1 for facilitating the fan E to draw external air or to discharge hot air in an interior of the device.

Referring to FIG. 3, the locating assembly D is provided with a plurality of flexible openings D1. To assemble the chassis air guide thermal cooling solution A, after having fixed the locating plate C to the interior of the device, an assembled position of the chassis air guide thermal cooling solution A is adjusted, and the locating assembly D, the locating plate C and a power supply H are fixed using screws.

Referring to FIG. 3-1, after having assembled the chassis air guide thermal cooling solution A at the interior, a distance between the accommodating ring G and the heat dissipating fan L is adjusted using the flexible ring F, so as to further favor a user to adjust a length of the flexible ring F for coordinating with equipment arrangement at the interior of the device.

According to the aforesaid structure, a wedge opening C1 of the locating plate C is fixed to the interior of the device using a screw, and is devised as a snap closure, a spring closure or a wedge structure applied at an interior of computer, electronic and electromechanical products.

According to the aforesaid structure, the fan E is connected to the interior of the device via a power line E2.

According to the aforesaid structure, the side panel B has dimensions same as those of the device according to equipments used.

According to the aforesaid structure, the accommodating ring G is an accommodating ring having a size corresponding to that of the heat dissipating fan at the interior of the equipment.

BRIEF DESCRIPTION OF THE DRAWINGS

FIG. 3-1 shows a second schematic view illustrating actions according to the invention.

FIG. 4-1 shows a second schematic view illustrating an embodiment according to the invention.

FIG. 4-2 shows a third schematic view illustrating an embodiment according to the invention.

DETAILED DESCRIPTION OF THE PREFERRED EMBODIMENTS

Figure 1:
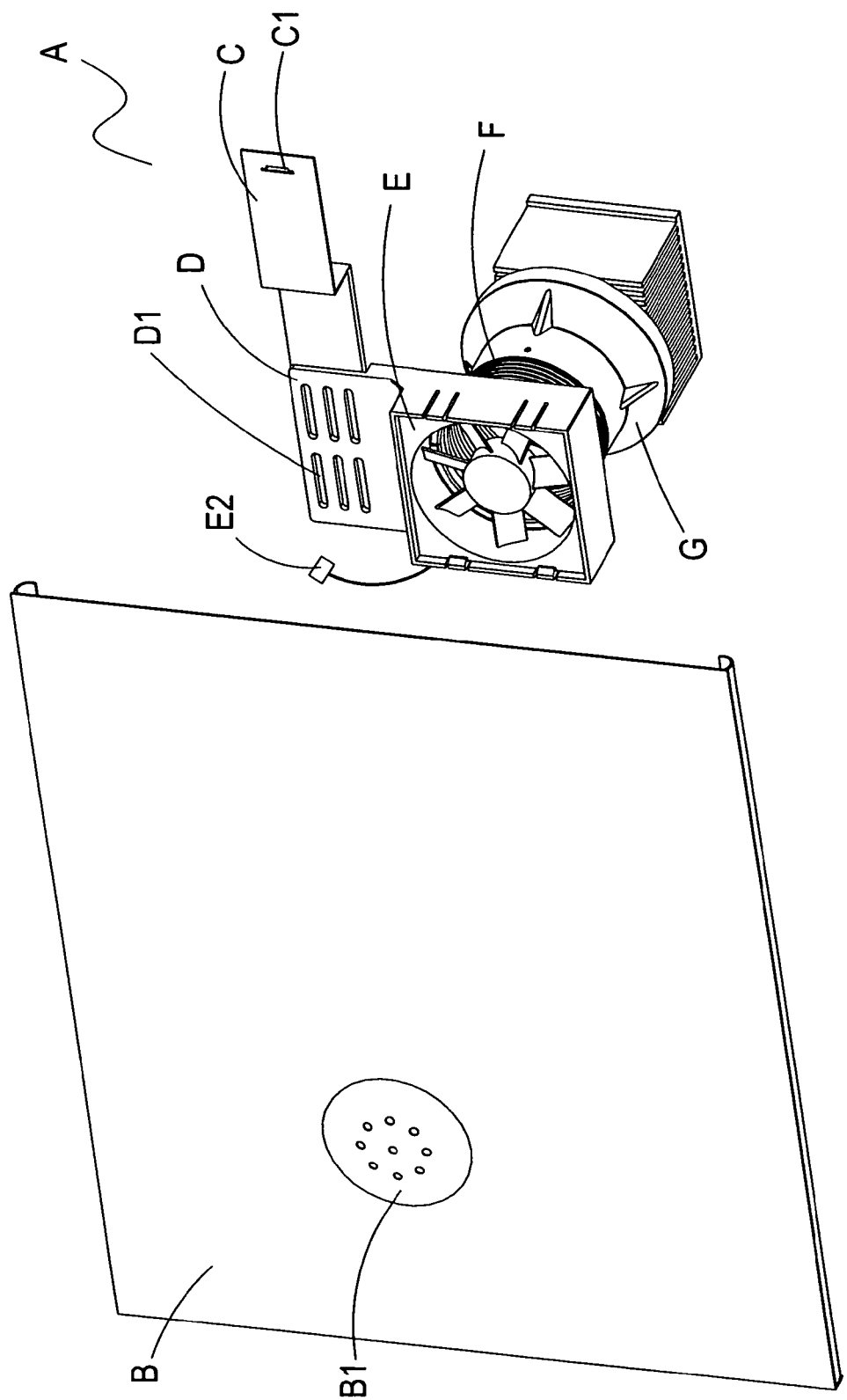
FIG. 1 shows an elevational view according to the invention.
Figure 2:
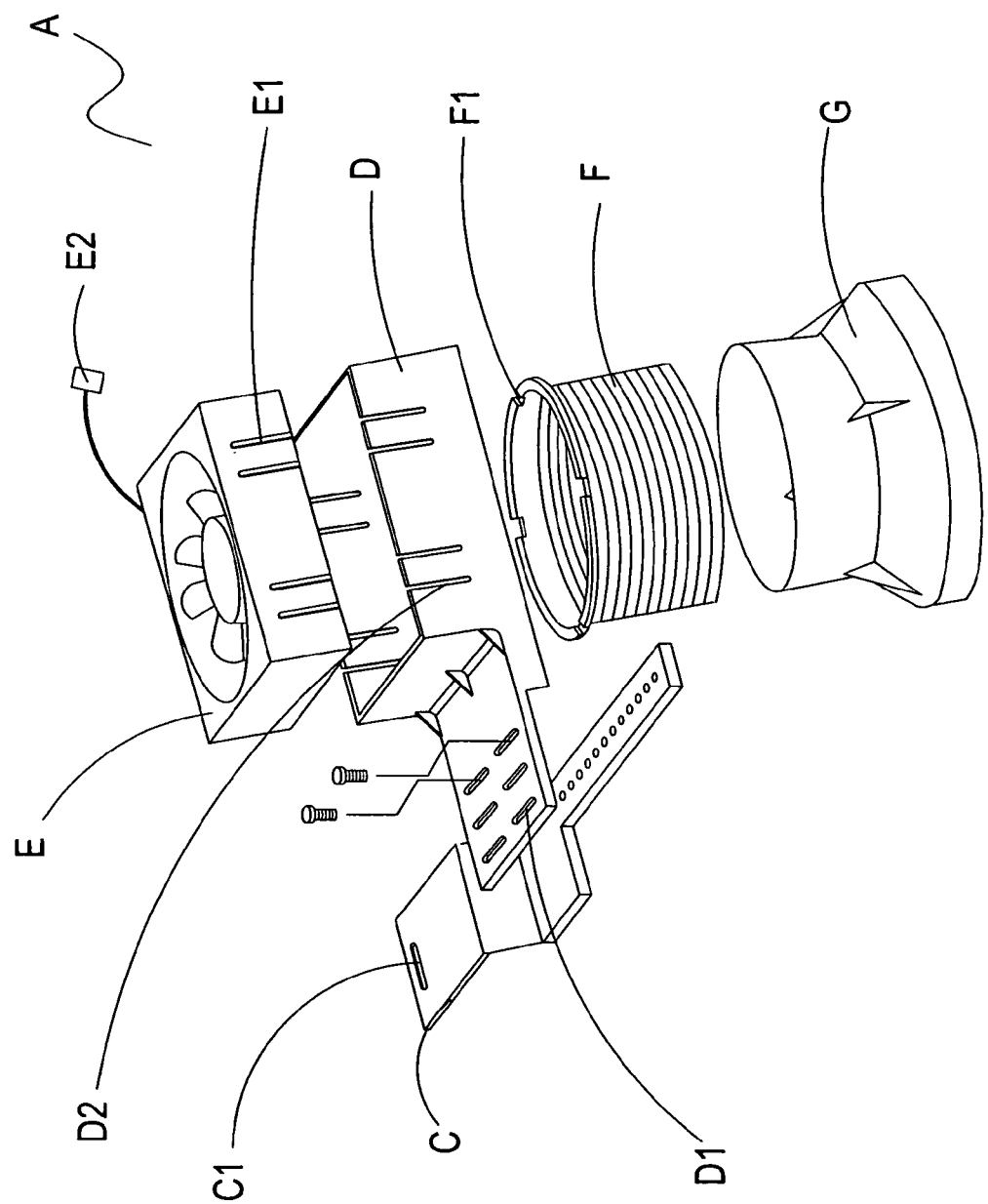
FIG. 2 shows an exploded elevational view according to the invention.
Figure 3:
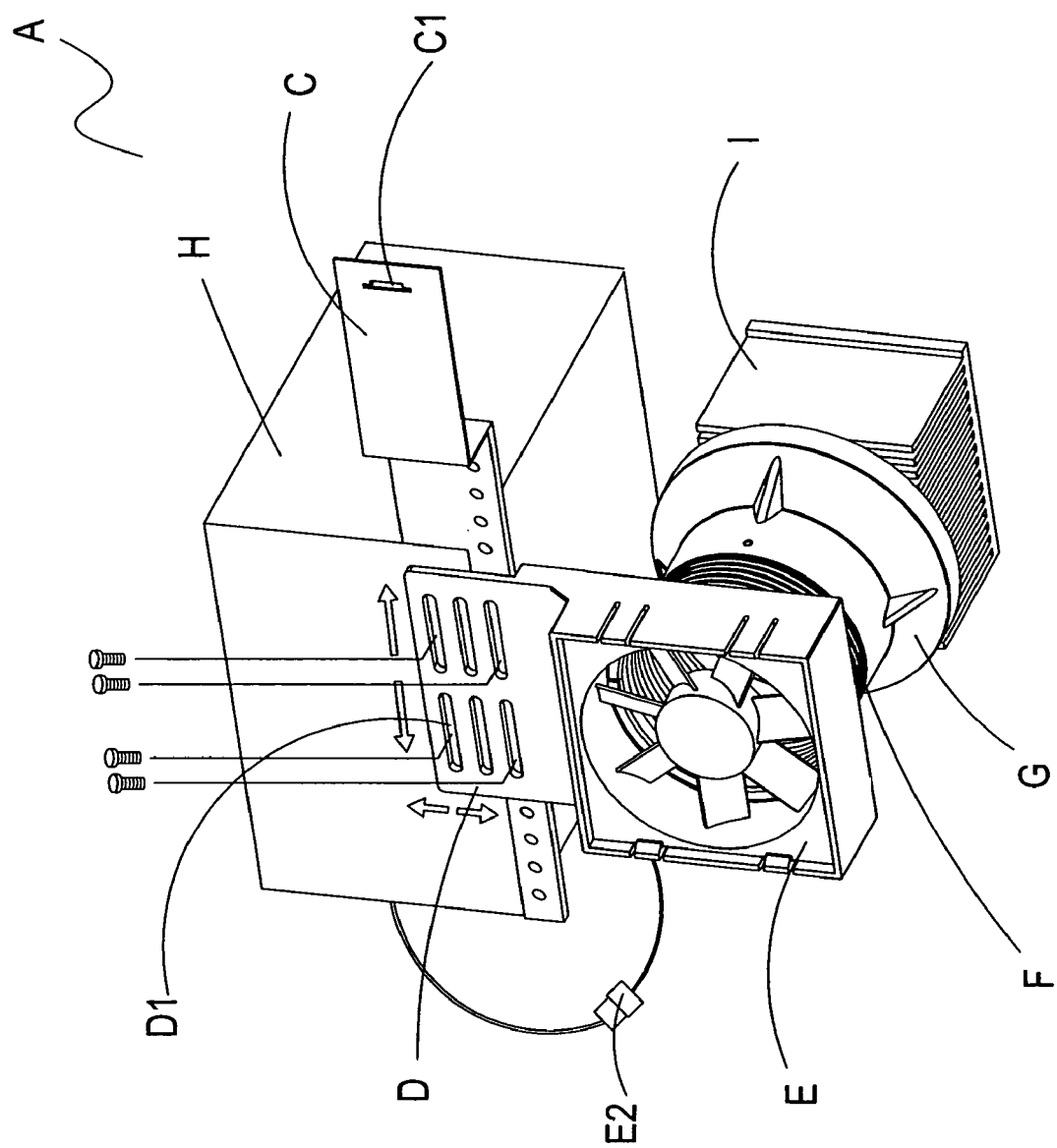
FIG. 3 shows a schematic view illustrating actions according to the invention.
Figures 1, 3:
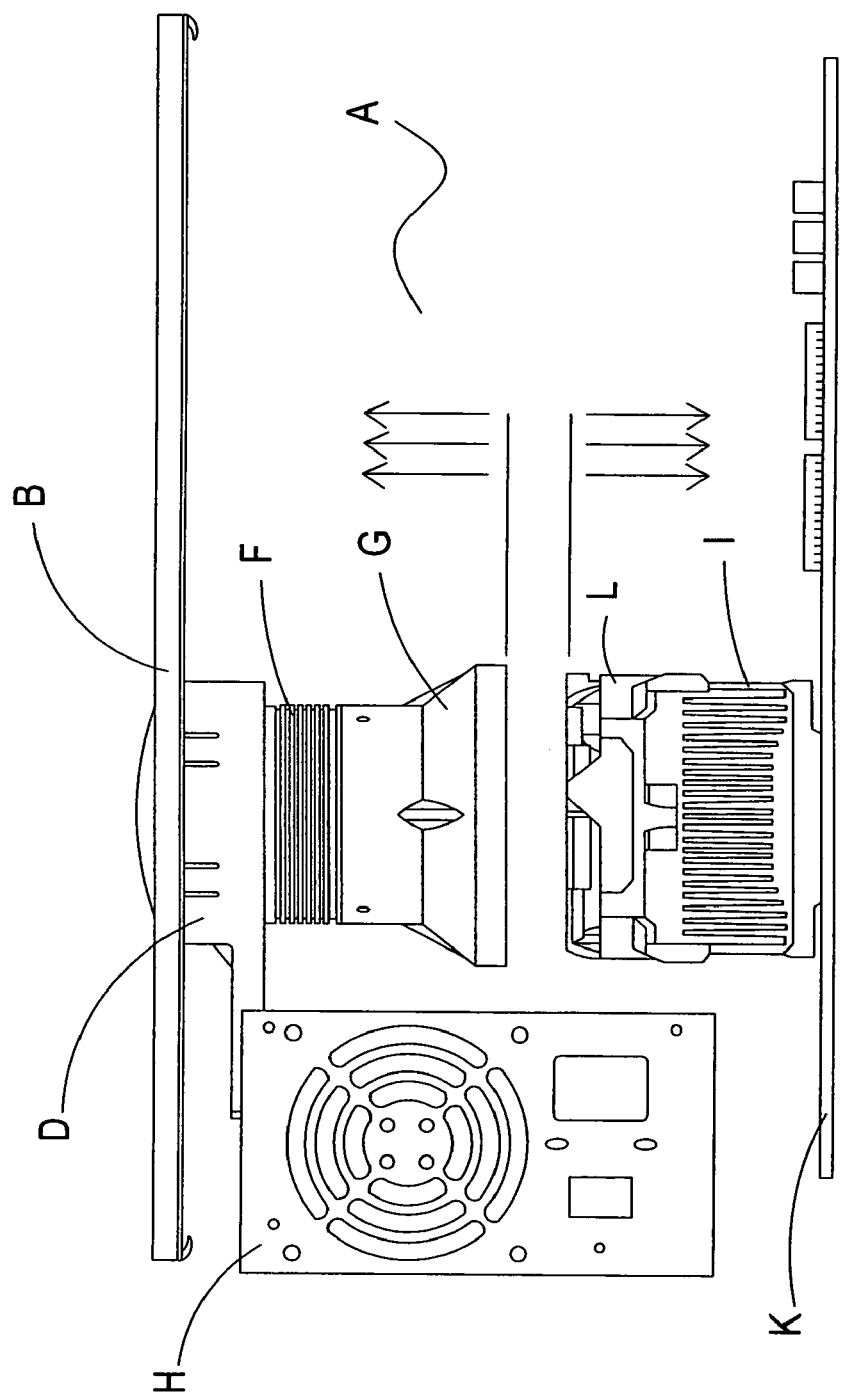
Figure 4:
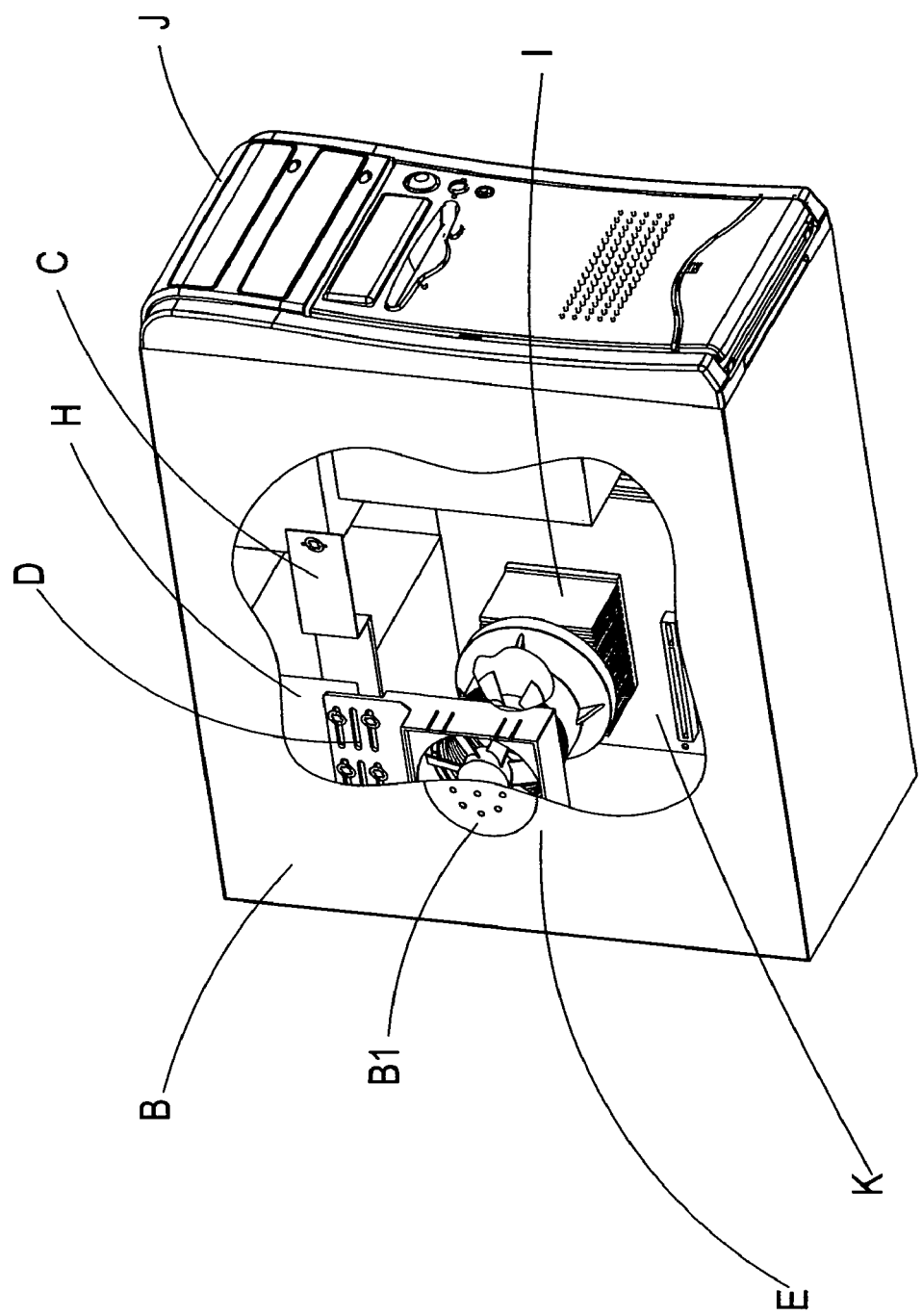
FIG. 4 shows a first schematic view illustrating an embodiment according to the invention.
Figures 1, 4:
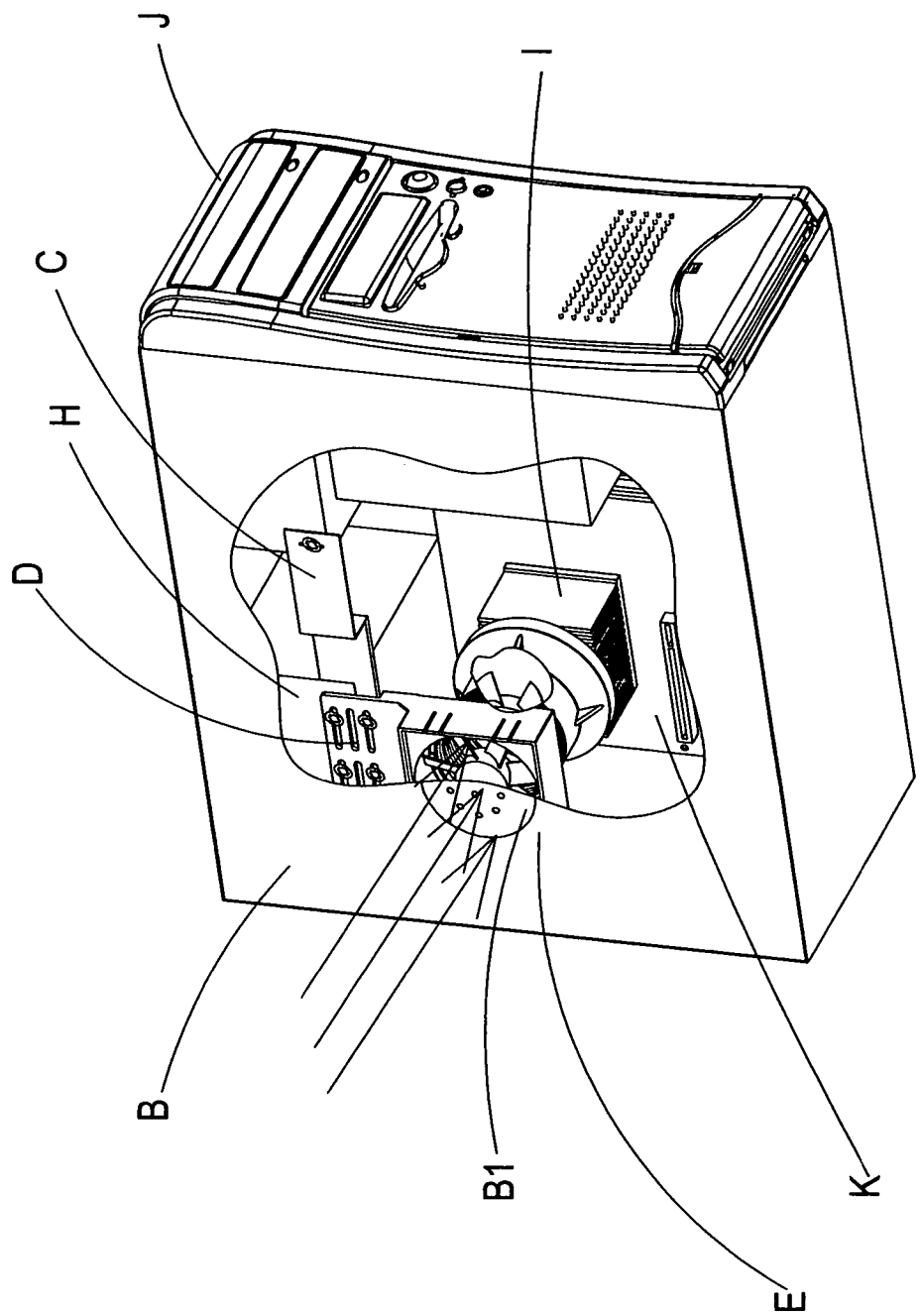
Figures 2, 4:
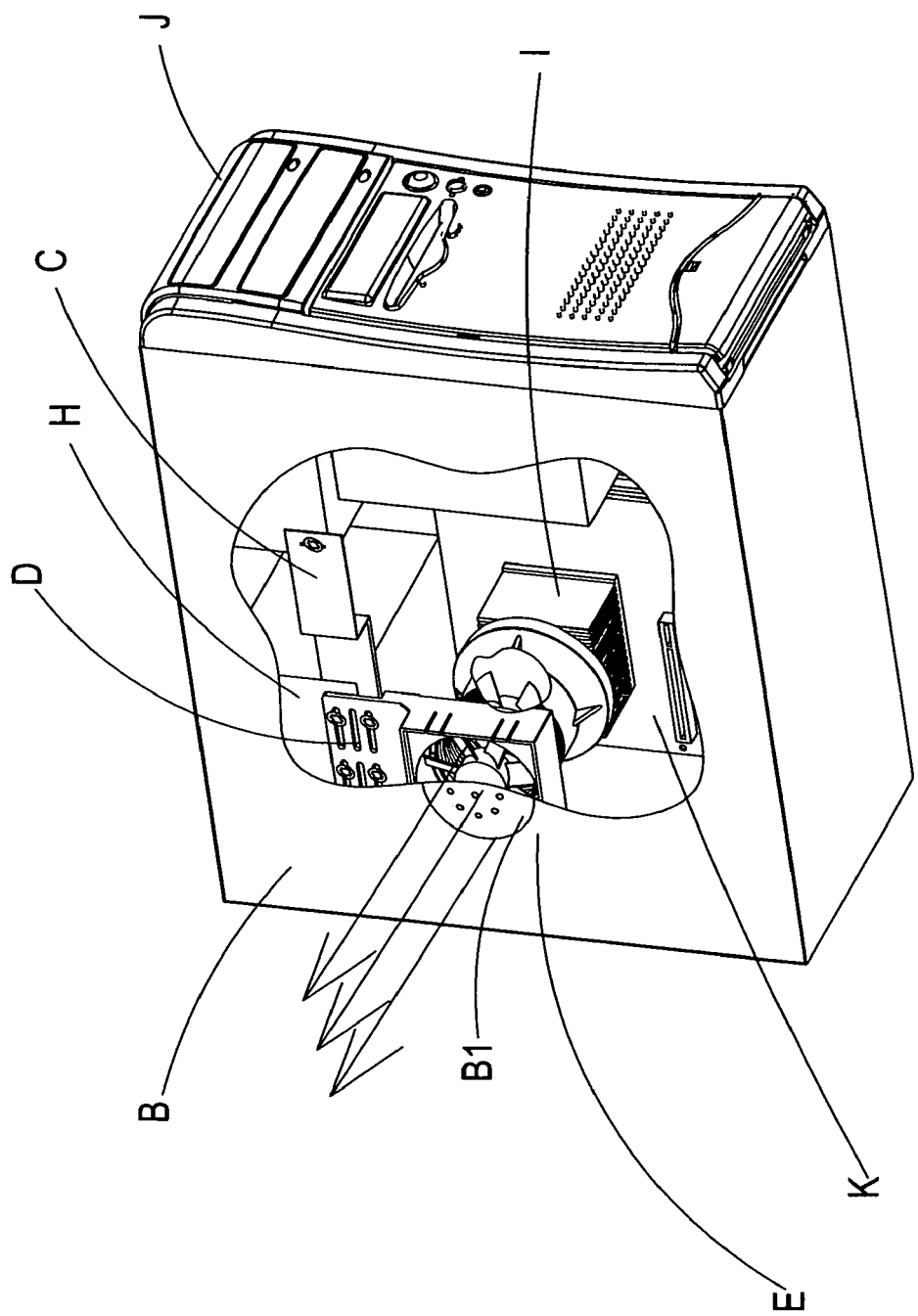

Referring to FIGS. 4, 4-1 and 4-2 showing an embodiment of a chassis air guide thermal cooling solution according to the invention, a motherboard D at an interior of a computer host J is provided with cooling fins I and a heat dissipating fan L.

The wedge opening C1 of the locating plate C is fixed to the interior of the computer host J using a screw. The flexible openings D1 of the locating assembly D are fixed with the locating plate C and the power supply H using screws. The fan E is connected with a power line H1 of the power supply H via a power line E2.

During operation of the computer host, for that the accommodating ring G is accommodated around the heat dissipating fan L, when the heat dissipating fan L blows air at the cooling fins I, cold air from an exterior is drawn by the flexible ring F and the fan E via the ventilation openings B1 at the side panel B. Thus, hot air at the interior of the device is not sucked in by the heat dissipating fan L to prevent the hot air from circulating at the interior of the device.

When the heat dissipating fan L discharges thermal energy of the cooling fins I, hot air is directly discharged by the flexible ring F and the fan E via the ventilation openings B1 of the side panel B, so that the hot air is also prevented from circulating within the interior.

To make the novelties and practicability of the invention more distinguishing, the invention is compared with the prior invention.

The prior invention has shortcomings of:
1. An interior of the prior device is an enclosed space having unsatisfactory convection with external air.
2. Hot air is continuously circulated by the heat dissipating device with reduced heat dissipating effects.
3. The heat dissipating device is incapable of performing direct convection with cold air at an exterior of the device, and hence air within the equipment constantly remains at high temperatures.
4. Convection relative to cold and hot air is hardly carried out, and high temperatures resulted are likely to cause shortened lifespan of electronic equipments.

The present invention has excellences of:
1. The fan is capable of drawing external cold air and discharging hot air at the interior of the equipment.
2. The size of the accommodating ring is corresponding to a size of the fan to enhance speed of air circulation and efficiency of convection.
3. The length of the flexible ring is adjustable according to a height of a user's need to promote heat dissipating effects.
4. Using the locating edges and locating assembly, the chassis air guide thermal cooling solution is applicable to a variety of equipments at the interior of the equipments.
5. The invention provides novelty and practicability.
6. The invention elevates industrial competitiveness.

It is of course to be understood that the embodiment described herein is merely illustrative of the principles of the invention. A wide variety of modifications made as equivalencies to descriptions and drawings of the invention may be effected by persons skilled in the art without departing from the spirit and scope of the invention as set forth in the following claims.

What is claimed is:

1. A chassis air guide thermal cooling solution comprising a side panel, a locating plate, a locating assembly, a fan, a flexible ring and an accommodating ring comprising protruding edges of the fan are wedged at wedge grooves of a locating assembly to locate the fan in the locating assembly, locating notches of the flexible ring are positioned in the locating assembly, the accommodating ring is accommodated around the flexible ring, and the locating assembly is fastened with the locating plate to a power supply by means of screws;

the side panel is devised with ventilation openings for facilitating the fan to draw external air or to discharge hot air at an interior of the device;

the locating assembly is provided with a plurality of flexible openings, and after having fixed the locating plate to the interior of chassis, an assembled position of the chassis air guide thermal cooling solution is adjusted, and the locating assembly, the locating plate and the power supply are fixed using screws; and after having assembled the chassis air guide thermal cooling solution at the interior, a distance between the accommodating ring and the heat dissipating fan is adjusted using the flexible ring, so as to further favor a user to adjust a length of the flexible ring for coordinating with equipment arrangement at the interior of the device.

2. The chassis air guide thermal cooling solution in accordance with claim 1, wherein the fan is connected with the power supply at the interior of the device via a power line.

3. The chassis air guide thermal cooling solution in accordance with claim 1, wherein the side panel is devised to have dimensions the same as those of the device.

4. The chassis air guide thermal cooling solution in accordance with claim 1, wherein the accommodating ring is an accommodating ring having a size corresponding to that of the heat dissipating fan at the interior of the device.

5. The chassis air guide thermal cooling solution in accordance with claim 1, wherein a combined structure of a wedge opening and the locating plate is devised as a snap closure, a spring closure or a wedge structure applied in an interior of the computer, electronic and electromechanical products.

* * * * *